United States Patent
Li et al.

(10) Patent No.: US 6,831,346 B1
(45) Date of Patent: Dec. 14, 2004

(54) BURIED LAYER SUBSTRATE ISOLATION IN INTEGRATED CIRCUITS

(75) Inventors: Gabriel Li, San Francisco, CA (US); Kenelm G. D. Murray, Sunnyvale, CA (US); Jose Arreola, Mountain View, CA (US); Shahin Sharifzadeh, Menlo Park, CA (US); K. Nirmal Ratnakumar, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 220 days.

(21) Appl. No.: 09/849,047

(22) Filed: May 4, 2001

(51) Int. Cl.[7] ............................................... H01L 29/00
(52) U.S. Cl. ..................... 257/499; 257/504; 257/509
(58) Field of Search ............................... 257/499, 504, 257/509

(56) References Cited

U.S. PATENT DOCUMENTS

| | | | |
|---|---|---|---|
| 4,799,098 A | * | 1/1989 | Ikeda et al. .................... 357/43 |
| 4,814,288 A | | 3/1989 | Kimura et al. |
| 4,862,242 A | * | 8/1989 | Wildi et al. .................... 357/48 |
| 4,881,107 A | | 11/1989 | Matsushita |
| 4,912,054 A | | 3/1990 | Tomassetti |
| 4,921,811 A | | 5/1990 | Watanabe et al. |
| 5,014,106 A | | 5/1991 | Maeda et al. |
| 5,148,255 A | | 9/1992 | Nakazato et al. |
| 5,268,312 A | | 12/1993 | Reuss et al. |
| 5,324,982 A | | 6/1994 | Nakazato et al. |
| 5,336,920 A | * | 8/1994 | Jimenez ....................... 257/481 |
| 5,348,907 A | | 9/1994 | Migita |
| 5,438,009 A | | 8/1995 | Yang et al. |
| 5,536,962 A | | 7/1996 | Pfiester |
| 5,623,159 A | | 4/1997 | Monk et al. |
| 5,691,224 A | | 11/1997 | Foerstner et al. |
| 5,691,226 A | | 11/1997 | Foerstner et al. |
| 5,757,051 A | | 5/1998 | Wu et al. |
| 5,976,926 A | | 11/1999 | Wu et al. |
| 6,051,868 A | * | 4/2000 | Watanabe et al. ........... 257/503 |
| 6,420,771 B2 | * | 7/2002 | Gregory ...................... 257/517 |

OTHER PUBLICATIONS

Chai et al., "A Cost–Effective 0.25μm $L_{eff}$ BiCMOS Technology Featuring Graded–Channel CMOS (GCMOS) and a Quasi–Self–Aligned (QSA) NPN for RF Wireless Applications," © 2000 IEEE, pp. 110–113.

* cited by examiner

*Primary Examiner*—Mary Wilczewski
*Assistant Examiner*—Monica Lewis
(74) *Attorney, Agent, or Firm*—Kevin L. Daffer; Mollie E. Lettang; Conley Rose P.C.

(57) ABSTRACT

In an embodiment of an integrated circuit structure having buried layer substrate isolation and a method for forming same, a buried layer having conductivity type opposite to that of an overlying well region is used for wells containing transistors prone to noise generation, where the wells are of the same conductivity type as the substrate. The buried layer may in some embodiments include a first portion underlying the transistor and a second portion spaced apart from and laterally surrounding the first portion. In some embodiments, the circuit may include a doped annular region of the same conductivity type as the buried layer, where the annular region contacts a portion of the buried layer and laterally surrounds the transistor. The circuit may further include metallization adapted to connect the well and annular region to opposite polarities of a power supply voltage, or in some embodiments to preclude such connection.

21 Claims, 6 Drawing Sheets

BURIED LAYER SUBSTRATE ISOLATION IN INTEGRATED CIRCUITS

BACKGROUND OF THE INVENTION

1. Field of the Invention

This invention relates to integrated circuit manufacturing, and more particularly to a substrate-isolated transistor and method for forming same.

2. Description of the Related Art

The following descriptions and examples are not admitted to be prior art by virtue of their inclusion within this section.

Mixed signal, or mixed mode, integrated circuits which include analog and digital circuit portions are becoming increasingly popular. For example, many wireless communications applications involve mixed signal integrated circuits. Noise problems can arise in such circuits because analog circuit portions tend to be noise-sensitive, while relatively high-power switching transistors, such as output transistors associated with the digital circuit portions, tend to generate noise. In a mixed signal circuit, noise from an output transistor can be coupled to an analog circuit portion through the semiconductor substrate shared by the entire integrated circuit. The severity of this noise coupling problem therefore depends upon how efficiently noise generated by a particular transistor is coupled to the substrate.

Digital circuits employ metal-oxide-semiconductor ("MOS") transistors, in which a gate conductor is arranged upon a gate dielectric formed on the substrate. The gate dielectric is positioned laterally between source and drain regions formed in the substrate, where the source and drain regions are doped either n-type or p-type to be of opposite conductivity type to the substrate. N-type source/drain regions are used to form n-channel transistors, and p-type source/drain regions to form p-channel transistors. In complementary MOS ("CMOS") circuits employing both n-channel and p-channel transistors, n-channel transistors are formed in p-type "wells" within the substrate, while p-channel transistors are formed in n-type wells. Such wells may be formed by selectively doping an epitaxial semiconductor layer grown upon the substrate. Doped regions can be formed in the substrate prior to growth of the epitaxial layer, thereby creating a "buried layer" beneath a well formed in the epitaxial layer. Such buried layers are typically heavily-doped layers having the same conductivity type as the overlying well. For example, an n+ (heavily-doped n-type) buried layer may underlie an n-type well, while a p+ buried layer underlies a p-type well. A buried layer may advantageously reduce the resistance of a well, facilitating electrical connection of the well to a particular voltage using a topside contact. This may be particularly important for wells containing bipolar transistors, as in a BiCMOS process combining bipolar and MOS transistors, since the well may serve as the collector region of the bipolar transistor. If buried layers of one conductivity type are used in a circuit, then buried layers of the other type are typically also included to provide electrical isolation between adjacent wells of the same conductivity type.

Integrated circuits are often formed on p-type silicon substrates. For circuits formed on a p-type substrate using buried layers such as those described above, direct resistive coupling through a p+ buried layer exists between the p-type wells used for n-channel transistors and the p-type substrate. It would therefore be desirable to develop a method and structure for reducing noise coupling of such transistors.

SUMMARY OF THE INVENTION

The problems outlined above are in large part addressed by an integrated circuit structure and method in which a buried layer having conductivity type opposite to that of the overlying well is used for wells containing transistors prone to noise generation, where the wells are of the same conductivity type as the substrate. For example, an n+ buried layer may be used beneath p-type wells containing noise-prone transistors formed over a p-type substrate. Such noise-prone transistors may include n-channel output buffer transistors, which may be larger and switch more current than other n-channel transistors in the integrated circuit, or semiconductor die. A doped annular region of the same conductivity type as the buried layer may be formed to laterally surround the transistor and make contact to the buried layer. In an embodiment, the buried layer of opposite conductivity type than the well is used only below wells which are of the same conductivity type as the substrate and contain output transistors. An integrated circuit containing such output transistors may also include analog circuit portions.

In an embodiment of the integrated circuit contemplated herein, metallization may be included to connect the doped annular region to one polarity (either most positive or most negative) of a supply voltage of the integrated circuit. Similarly, metallization may be included in the integrated circuit to connect the well region to one polarity of the supply voltage. These voltage polarities may be such that a p-n junction between the doped annular region and the well is reverse-biased. In such an embodiment, therefore, the metallization may be adapted to connect opposite-polarity supply voltages to the well and doped annular regions. Reverse-biasing the junction between the buried layer and the well may in some cases disadvantageously cause depletion regions within the well to merge below the transistor, however, possibly allowing carrier movement between the transistor and the buried layer and/or annular region. In other embodiments, therefore, the metallization may be adapted to leave the doped annular region floating or to connect it to the same voltage polarity as the well. In still a further embodiment, the buried layer may be formed in two portions: a central portion underlying the transistor, and a separate portion spaced apart from and laterally surrounding the central portion. A doped annular region surrounding the transistor may contact the outer portion of the buried layer. In such an embodiment, the central portion of the buried layer remains electrically "floating" regardless of the voltage applied by a topside contact to the doped annular region.

In an embodiment of a method contemplated herein for forming an integrated circuit, a well region is formed over a doped structure formed within a semiconductor substrate, where the well region is of the same conductivity type as the substrate and the doped structure is of opposite conductivity type than the substrate. A transistor may be formed in the well region. A doped annular region of the same conductivity type as the doped structure may further be formed surrounding the well region to contact the underlying doped structure. In an embodiment, metallization may be formed, where the metallization is adapted to connect the doped annular region and the well region to opposite polarities of a supply voltage. In an alternative embodiment, metallization adapted to preclude connection of the doped annular region and the well region to opposite polarities of a supply voltage may be formed. In a further embodiment, the doped structure may include a first portion and a second portion spaced apart from and laterally surrounding the first portion. In such an embodiment, a doped annular region may be formed to make contact to the second portion of the doped structure.

The integrated circuit and method described herein may advantageously reduce noise coupling of output transistors into the semiconductor substrate by providing substrate isolation for wells of the same conductivity type as the substrate and containing such output transistors. The performance of analog circuit portions included in the same semiconductor die may therefore be improved. The buried layer embodiments described herein may be formed by modifying the buried-layer mask typically used in BiCMOS/CMOS integrated circuit formation. Therefore, no additional masks are required to implement the integrated circuit and method.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
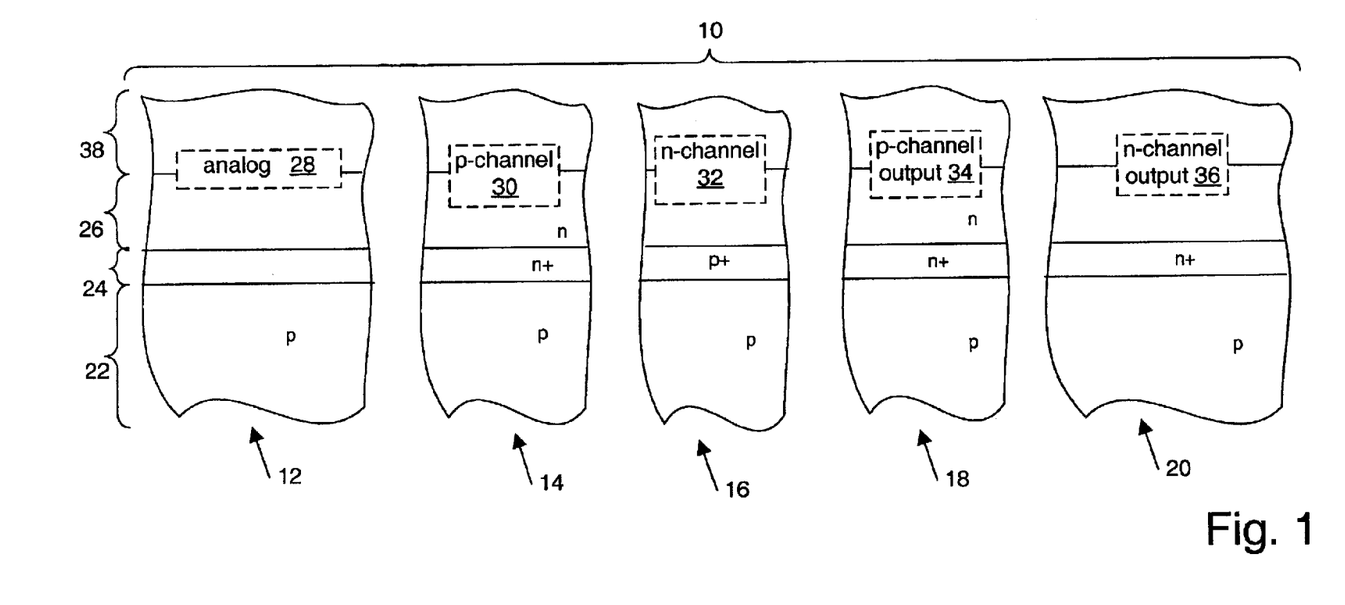
FIG. 1 is a partial cross-sectional view of an integrated circuit including output transistors and an analog circuit portion.

A partial cross-sectional view of an exemplary integrated circuit 10 employing the transistor isolation described herein is shown in FIG. 1. The drawing is not to scale, and omits details not relevant to the current discussion. In the embodiment of FIG. 1, integrated circuit 10 includes die portions 12, 14, 16, 18 and 20. The portions are shown separated from one another to indicate that they may be spaced apart across the die, although they may also be adjacent to one another. The order in which the portions are arranged may also be different than shown in FIG. 1. Additional features not shown, such as dielectric isolation regions or junction isolation regions (e.g., guard rings), may appear between one or more of the portions. All portions of the die in this embodiment share a common p-type substrate 22. Above the substrate (actually formed in the upper part of the substrate, but shown here as a separate layer for clarity) is heavily doped buried layer 24. The conductivity type of the buried layer depends on the particular portion of the die, as discussed further below. An epitaxial layer 26 is arranged above buried layer 24. Doped well regions are formed in the epitaxial layer, with the conductivity type of the well regions depending on the particular portion of the die.

Transistors and other integrated circuit elements may be formed within and upon epitaxial layer 26 using techniques recognized by those skilled in the art of integrated circuit fabrication. Such circuit elements are represented by dashed-line boxes in FIG. 1. For example, die portion 12 includes analog circuit portion 28, while die portions 14 and 16 include p-channel circuit portion 30 and n-channel circuit portion 32, respectively. Die portions 18 and 20 include p-channel output circuit portion 34 and n-channel output circuit portion 36, respectively. Circuit portions 28, 30, 32, 34 and 36 may each include a single transistor, or may include multiple transistors and/or other circuit elements. Metallization layer 38, arranged above epitaxial layer 26 and the circuit portions, generally includes conductive contact structures and interconnects interposed with insulating material (details not shown). The interconnects are adapted to connect the circuit portions with each other and with contact pads at the periphery of the die.

The extent to which any of circuit portions 28, 30, 32, 34 and 36 couples noise into common substrate 22 depends on factors including how much noise is generated by a particular circuit portion and the isolation properties of the corresponding die portion. In die portion 12 containing analog circuit portion 28, the conductivity type of buried layer 24 and epitaxial layer 26 are not specified, since this depends on the particular technology used for the analog circuit. The buried layer and epitaxial layer for portion 12 may be of the same conductivity type, however. In general, the die portion 12 containing analog circuit portion 28 may include p-type wells on p-type buried layers for n-channel transistors and n-type wells on n-type buried layers for p-channel transistors. The n-channel transistors in analog circuit portion 28 are particularly susceptible to noise coupled through the p-type substrate from other circuit portions. In the embodiment of FIG. 1, the buried layer and epitaxial layer are of the same conductivity type for portions 14, 16 and 18, which contain p-channel logic, n-channel logic and p-channel output transistors, respectively. For die portion 20 containing n-channel output transistor 36, however, epitaxial layer 26 is p-type while buried layer 24 is n-type (heavily-doped n-type, or n+, in this embodiment). Use of a buried layer having opposite conductivity type than the overlying well in die portion 20 removes the direct resistive coupling that would exist between the p-type well and the p-type substrate if a p+ buried layer were used. Therefore, coupling into substrate 22 of noise associated with switching of the n-channel output transistor is significantly reduced. Coupling of this noise to the other circuit portions, including noise-sensitive analog circuit portion 28, is therefore reduced as well. Although the embodiment of FIG. 1 and all other embodiments described herein include a p-type substrate, a similar improved circuit could be formed on an n-type substrate. In such an embodiment, the buried layers beneath any p-channel output transistors would be p-type rather than n-type, to reduce coupling of noise from the n-type well to the n-type substrate.

Figure 2:
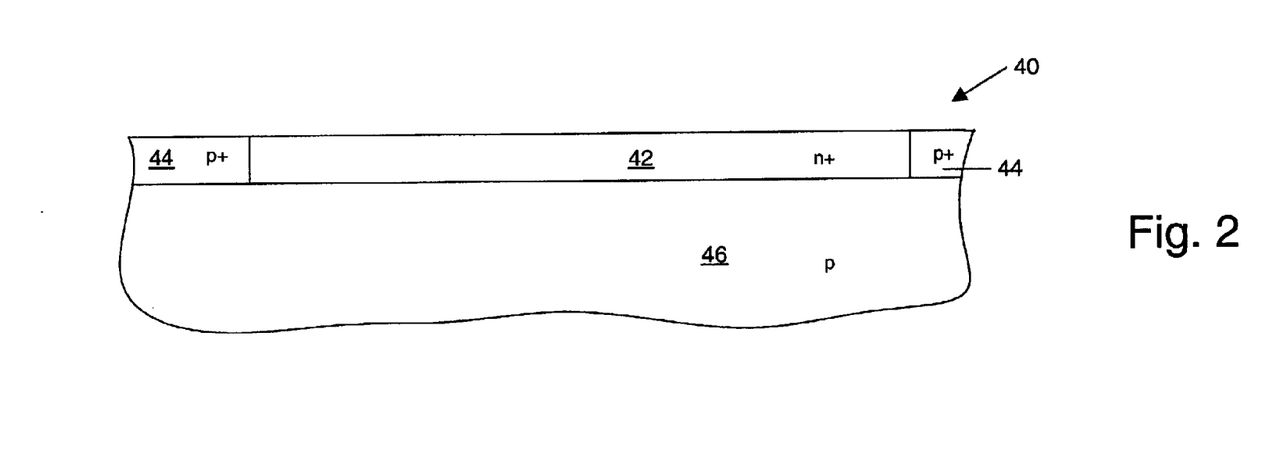
FIG. 2 is a partial cross-sectional view of a semiconductor die portion including a doped structure within a semiconductor substrate.

An exemplary embodiment of a method for forming an isolated transistor is shown in the partial cross-section views of FIGS. 2–5. As shown in FIG. 2, semiconductor die portion 40 may include n+-doped structures 42 and p+ structures 44 formed in an upper portion of semiconductor substrate 46. Semiconductor substrate 46 is preferably a p-type silicon wafer. The method and structure described herein may be applicable to other semiconductor materials, however, and an n-type substrate could also be used in a variation of the method and structure, as noted above. In some embodiments, substrate 46 could be a semiconductor layer formed over a separate semiconducting or non-semiconducting substrate. When a p-type silicon substrate is used, the carrier concentration of the substrate is preferably less than $10^{16}$ cm$^{-3}$, and more preferably between about 1 and $2 \times 10^{15}$ cm$^{-3}$. In an embodiment, n+ doped structure 42, along with other similar n+ structures distributed across the wafer and not shown, may be formed by implantation of an n-type impurity through a patterned masking layer which covers the portions of substrate 46 in which p+ structures are desired while exposing portions of the substrate in which n+ structures are desired. Arsenic is a preferred n-type impurity for the n-type implantation into silicon, though other n-type impurities such as antimony may also be suitable. The implantation is preferably designed such that, after appropriate annealing/drive-in and subsequent processing, a peak concentration of the n+ layer is greater than $10^{19}$ cm$^{-3}$. The concentration is more preferably between about $2 \times 10^{19}$ and $5 \times 10^{19}$ cm$^{-3}$. A suitable implant dose may be approximately $5 \times 10^{15}$ cm$^{-2}$. After subsequent processing, n+ doped structure 42 preferably extends between about 0.5 and 2.0 microns into the substrate 46, and more preferably to a depth of about 1 micron. Subsequent diffusion may also extend doped structure 42 upward into a subsequently-formed epitaxial layer, as discussed further below.

Heavily doped p-type structures 44, along with other similar p+ structures which may appear across substrate 46, may be formed by a blanket implantation of p-type impurities into substrate 46 after removal of the masking layer used to form n+ structure 42. Because p-type impurities are implanted into n+ structure 42, the implant dose of the p-type impurities is preferably at least a factor of 10 smaller than that of the n-type impurities used to form n+ structure 42. In this way, the net carrier concentration of n+ structure 42 may not be significantly affected by the formation of p+ structures 44. In an embodiment, the carrier concentration of p+ structure 44 is preferably between about $10^{16}$ cm$^{-3}$ and $10^{17}$ cm$^{-3}$, and still more preferably in a range from about 1 to about $3 \times 10^{16}$ cm$^{-3}$. Although generally referred to as "p+", structure 44 may not actually be doped to a level any higher than that of subsequently-formed p-type well regions. Suitable p-type impurities for formation of p+ structures 44 may include boron. The vertical extent of p+ structures 44 may be similar to that of n+ structure 42. In an embodiment, the vertical extent is in a range from about 1 to about 2 microns. Although formation of the p+ structures after the n+ structures may be preferable because of the higher diffusivity of boron as compared to arsenic in silicon, the order of the implants could be reversed in some embodiments. Similarly, the p-type implant could be masked rather than the n-type implant in some embodiments, with the p-type implant having the higher concentration. Higher p-type concentrations may also be less desirable because of diffusion considerations, however. In another embodiment, both the n-type and p-type implants may be done through separate patterned masking layers. Doped structures 42 and 44 might also be formed in ways other than ion implantation, such as by a diffusion process.

Figure 3:
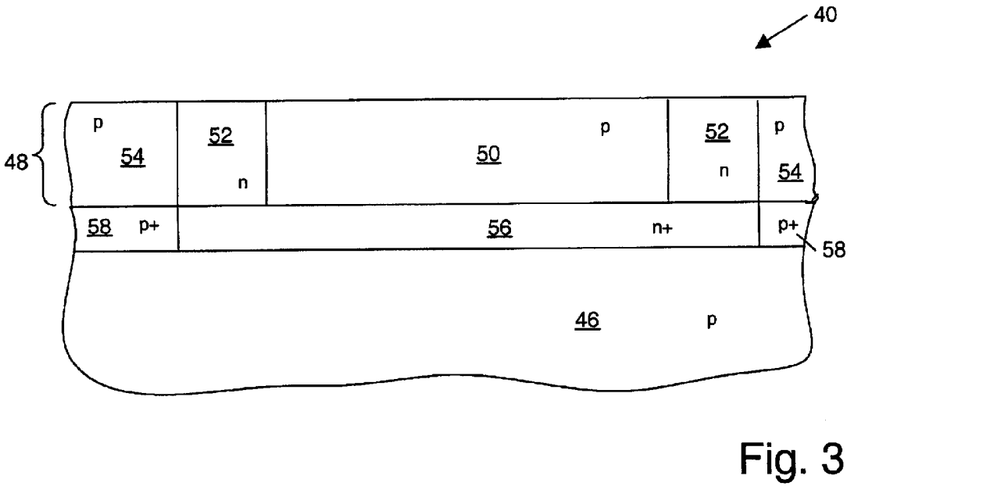
FIG. 3 is a partial cross-sectional view of the die portion with an epitaxial layer grown over the doped structure to form a well region overlying a buried layer.

An epitaxial semiconductor layer 48 may be grown upon substrate 46, as shown in FIG. 3. Covering them with epitaxial layer 48 creates n+ buried layer 56 and p+ buried layers 58 from doped structures 42 and 44, respectively. A p-type well 50 is shown formed within epitaxial layer 48 and laterally in the center of die portion 40. An annular n-type region, appearing in the cross-section of FIG. 3 as n-type regions 52, may be formed laterally surrounding p-type well 50. As used herein, "annular" refers to an encircling shape which may be rectangular, circular, or any shape suitable for surrounding another region. Additional p-type wells 54 may be arranged adjacent annular region 52, and further n-type and p-type wells not shown may be arranged across the entire semiconductor die of which die portion 40 is a part. In some embodiments, the epitaxial layer may be doped during growth to an appropriate level for either the p-type or n-type wells. Further impurity introduction might be needed only for the other well type in such an embodiment. Dielectric isolation regions, not shown in FIG. 3, may also be included at the surface of epitaxial layer 48, associated with some or all of the n-well/p-well boundaries. Such dielectric isolation regions may be formed by methods including shallow trench isolation and local oxidation of silicon. Additional p-type wells 54 may be used for isolation of adjacent n-type structures. Such wells may be covered at the surface by dielectric isolation regions. The p+ buried layers 58 underlying wells 54 may similarly serve to isolate adjacent n+ buried layers. Alternatively, p-type wells such as wells 54 may have one or more transistors or other circuit elements formed within them.

In an embodiment for which epitaxial layer 48 is an epitaxial silicon layer, layer 48 may be grown by, for example, decomposition of silane or decomposition of dichlorosilane. P-type wells 50 and 54, along with other p-type wells arranged across the die and not shown in FIG. 3, may be formed by implantation through a patterned masking layer, followed by an annealing or drive-in step. Similarly, n-type doped annular structure 52 may be formed along with other n-type wells on the die by implantation through a patterned masking layer and subsequent annealing. In some embodiments, formation of these patterned masking layers involves patterning of a nitride layer for one implantation, then growth of an oxide over the implanted regions and selective removal of the nitride layer to expose portions of the substrate for the other implantation. A process other than ion implantation, such as a diffusion process, may also be used to form the wells in some embodiments. The n-type and p-type wells may be doped to a carrier concentration in the range of $10^{17}$ cm$^{-3}$. The carrier concentration of substrate 46 in such an embodiment may be between about 1 and $2 \times 10^{15}$ cm$^{-3}$. Epitaxial layer 48 is preferably grown to a thickness between about 0.5 and 1.5 microns, and more preferably to a thickness of about 0.9 micron. Because of diffusion of buried layers 56 and 58 up into the epitaxial layer, the depths of the n-wells and p-wells may be smaller than the thickness of the epitaxial layer. After diffusion during subsequent processing, for example, the depth of p-well 50 may be between about 0.5 and 1 micron.

Although described herein in terms of epitaxial layer growth over doped structures to form buried layers, the buried layers and wells could also be formed by other methods. In particular, high-energy ion implantation could be used to form a buried layer without the need for an epitaxial layer. Such a high-energy implant can effectively "bury itself" within the substrate. To form an n+ buried layer in silicon, for example, implantation of and n-type dopant such as phosphorus or arsenic at an energy of about 1 MeV or higher may be suitable. A p+ buried layer may be formed by a similar implantation of a p-type impurity such as boron.

Wells may then be formed above the buried layers through introduction of shallower impurity distributions using, for example, ion implantation at lower energy than that used to form the buried layers (e.g., in the tens of keV).

Figure 4:
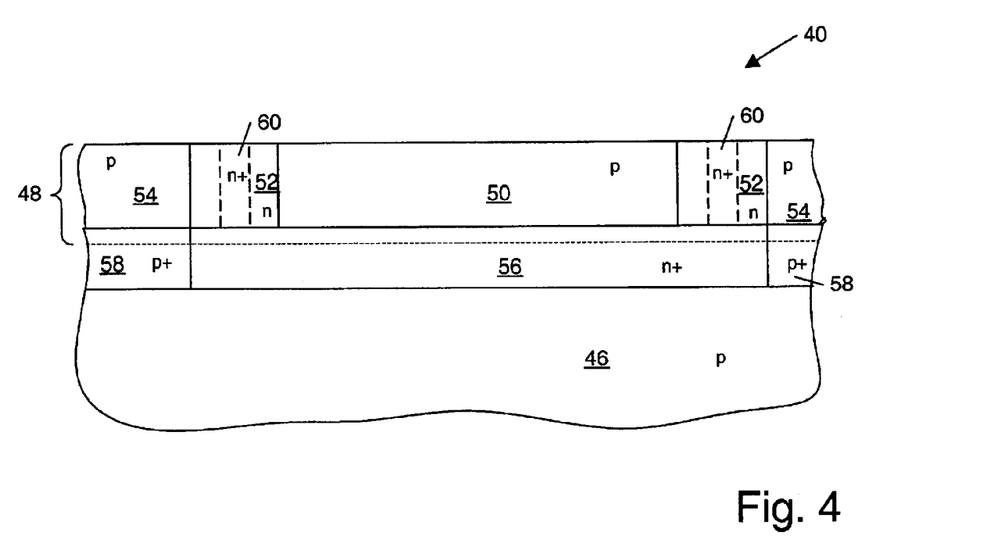
FIG. 4 is a partial cross-sectional view of the die portion including a heavily doped guard ring making contact to the buried layer.

Turning now to FIG. 4, an annular deep n+ tap structure 60 is formed within doped annular structure 52. Tap structure 60 connects with n+ buried layer 56, and allows a lower-resistance connection to the buried layer from any contacts subsequently formed upon the upper surface of annular structure 52. Forming the n+ structure within structure 52, rather than heavily doping all of structure 52, allows a higher breakdown voltage to be maintained between annular structure 52 and adjacent p-type wells. In embodiments for which structure 52 is not connected to any particular voltage, as discussed further below, tap structure 60 may not be needed. Tap structure 60 may be formed by introducing n-type impurities through a patterned masking layer, in a manner similar to that described above with reference to the buried layers and well regions. In the embodiment of FIG. 4, the upper boundary of buried layers 56 and 58 is shown within epitaxial layer 48, as may occur due to diffusion. The lower boundary of epitaxial layer 48 is shown with a dashed line. Such diffusion could occur, alternatively or in addition, at other times during the integrated circuit fabrication.

Figure 5:
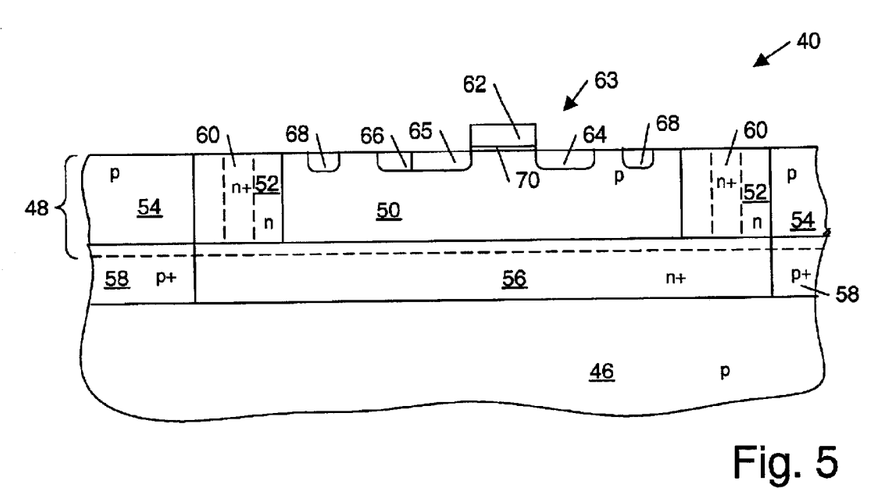
FIG. 5 is a partial cross-sectional view of the die portion including a transistor and well taps formed within the well region.

A transistor 63 may subsequently be formed in and upon p-type well 50, as illustrated in FIG. 5. Gate 62 may be formed upon gate dielectric 70 and between n-type source region 65 and drain region 64, such that an n-channel transistor is formed. Well tap regions (or contact diffusions) 66 and 68 are of the same conductivity type as the well (p-type, in this case) and are used in connecting a voltage to the well to prevent forward-biasing of p-n junctions within the circuit. A p-type well such as well 50 is therefore typically connected to the low polarity of the circuit's power supply (typically 0 volts). Use of a n-type buried layer under the p-well as described herein may increase the resistance of the p-well, and make it particularly important to thoroughly make contact to the p-well. In particular, it may be important that p+ tap region 66 is adjacent the source of the transistor, so that forward-biasing of the junction between the source and surrounding well material may be prevented. An annular p+ well tap 68 laterally surrounding the transistor may also be used. Although such well tap regions may also be referred to herein as contact diffusions, they are often formed using ion implantation. Other transistors and circuit elements in other well regions across the semiconductor die are preferably formed concurrently with transistor 63. Transistor 63 is preferably a noise-producing transistor such as an output buffer transistor. The combination of buried layer 56 and annular structure 52 provides junction isolation surrounding transistor 63 and reduces coupling of noise from the transistor into substrate 46 and thereby to other portions of the circuit. A non-output transistor or another type of circuit element or circuit could be formed within well 50, but a layout penalty may result from additional well taps which may be needed to properly contact the well as described above. Such a layout penalty may not be considered worthwhile in the case of circuit elements for which a large noise improvement is not realized (e.g., circuits which are not particularly noisy to begin with).

Figure 6:
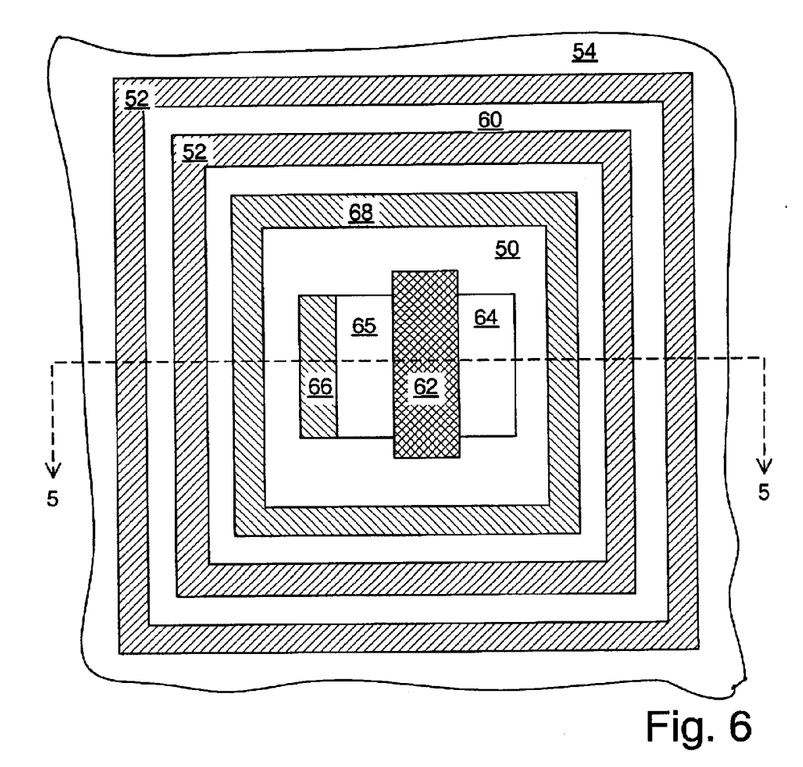
FIG. 6 is a partial top view of the die portion of FIG. 5.

An exemplary top view of circuit portion 40 corresponding to the embodiment of FIG. 5 is shown in FIG. 6, with a cut showing the position of the cross-section of FIG. 5. The top view of FIG. 6 illustrates the lateral surrounding of transistor 63 in this embodiment by annular p+tap 68 and annular n-well 52. This view may also be useful in illustrating metallization options for circuit portion 40. Examples of such metallization options are shown in FIG. 7. The views of FIG. 7 illustrate conductive interconnect lines used to connect particular features of circuit portion 40 to contact pads used for connection to external power supply leads of the ensuing packaged integrated circuit. Such contact pads may be arranged at the periphery of the semiconductor die, or may be spaced across the die, depending on the packaging technology used. It is noted that the views of FIG. 7 may be greatly simplified by comparison to actual interconnect lines, which may include multiple bends and be routed using multiple metallization levels. Furthermore, many needed interconnects, such as those connecting transistor 63 to other transistors and/or circuit elements, are not shown in the views of FIG. 7.

Figure 7A:
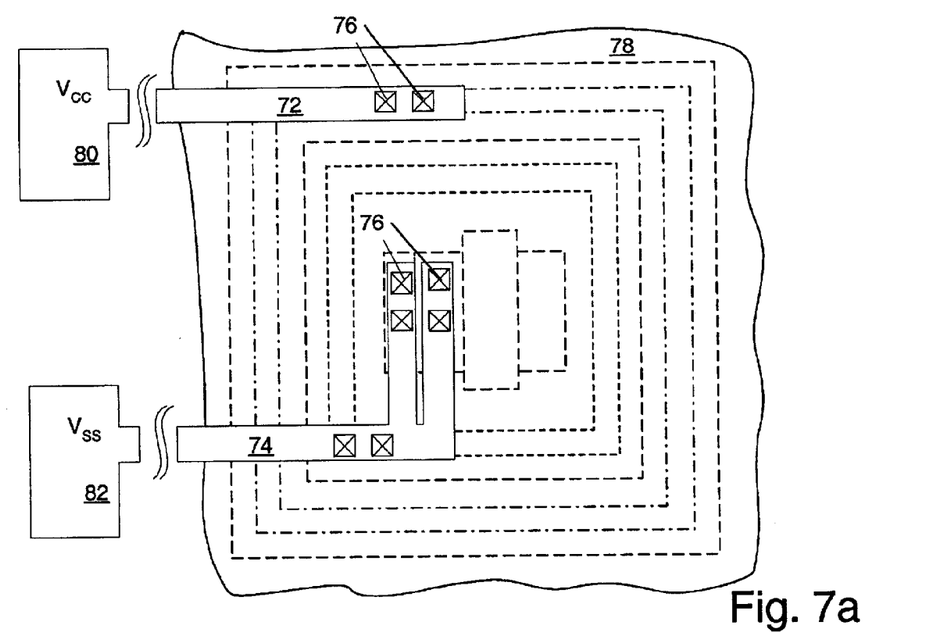
FIGS. 7a, 7b , 7c, and 7d illustrate exemplary metallization configurations for forming power supply contacts to the die portion of FIG. 6.

Interconnect lines such as lines 72 and 74 of FIG. 7a are vertically isolated from the features shown in FIG. 6 by an interlevel dielectric layer 78. Contacts 76 extend through the interlevel dielectric to contact the appropriate features below. The contacts shown in FIG. 7 are intended to indicate only which features are being contacted, and not the particular number or size of contacts used. Dashed lines in FIG. 7 indicate the boundaries of the features underlying interlevel dielectric 78 in this embodiment. By reference to these dashed lines and the top view of FIG. 6, it can be seen that interconnect line 72 of FIG. 7a makes contact to tap structure 60 within doped annular structure 52, and thereby to n+ buried layer 56 as well. Interconnect 72 extends to contact pad 80, which is designated for connection to $V_{CC}$, the high power supply voltage for the circuit portion. Multiple other features on the semiconductor die not shown in FIG. 7a may also be connected to contact pad 80, using interconnect 72 or other interconnects not shown. During packaging of the semiconductor die, pad 80 is connected to an external lead which is connected to the high polarity of the supply voltage during operation of the packaged integrated circuit. Interconnect 74 of FIG. 7a makes contact to source 65 and well tap regions 66 and 68, and connects these features to contact pad 82. Contact pad 82 is designated for connection to $V_{SS}$, or the low power supply voltage for the circuit portion. The metallization of the integrated circuit, which includes interconnects 72 and 74 and contact pads 80 and 82, is therefore adapted in the embodiment of FIG. 7a to connect well region 50 and doped annular region 52 to opposite polarities of the supply voltage for the circuit portion. For example, in an embodiment for which a 3-volt supply is used, the well would be connected to 0V and the guard ring 52 to 3V. In some embodiments, interconnect 72 could be used to connect guard ring 52 to an on-chip filtered, or "quiet" $V_{CC}$. The filtered $V_{CC}$ may be referred to as $V_{CCQ}$, and the external $V_{CC}$ as $V_{CCN}$. Such a connection may cause the $V_{CCQ}$ supply to be affected by noise associated with transistor 63, however.

Figure 7B:
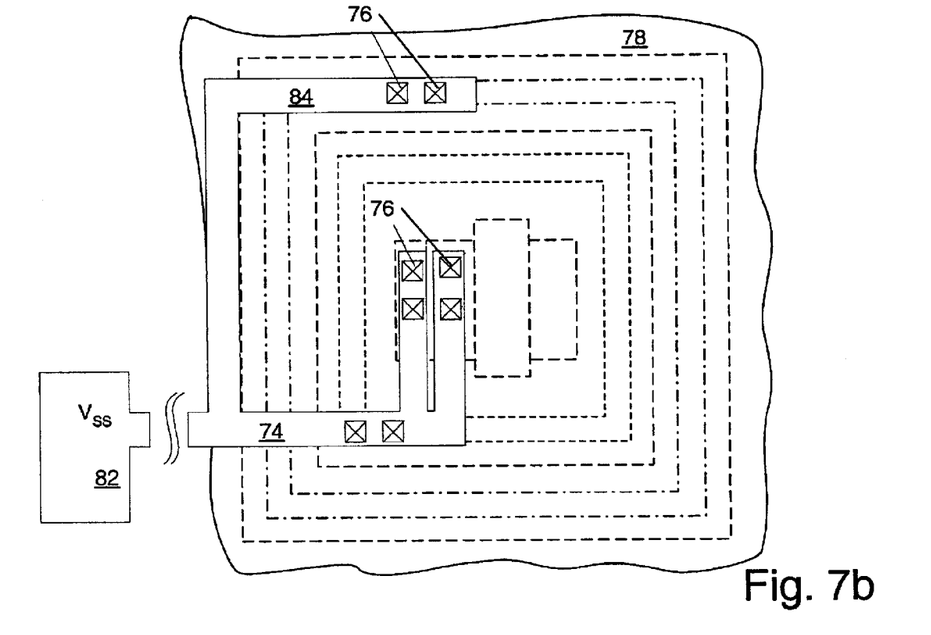
Figure 7C:
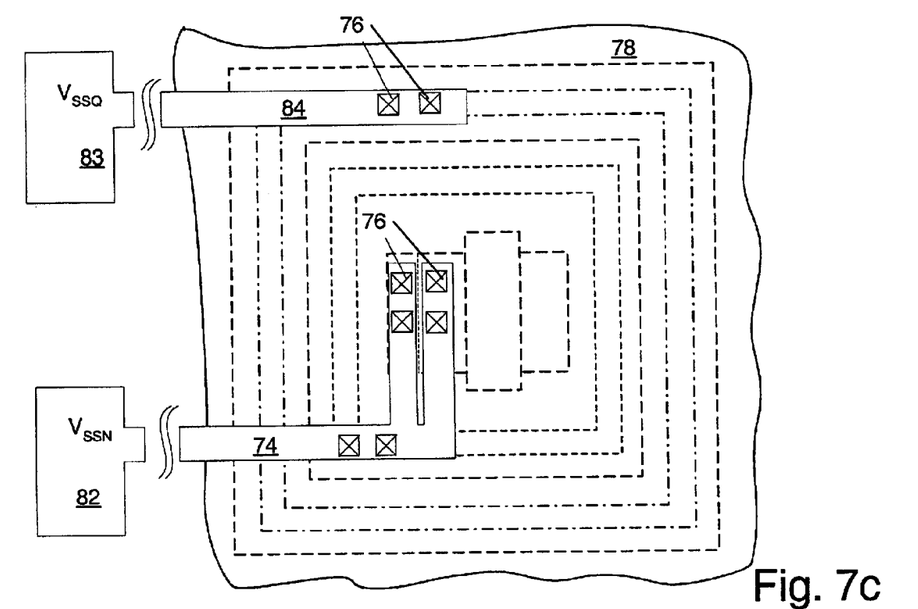
Figure 7D:
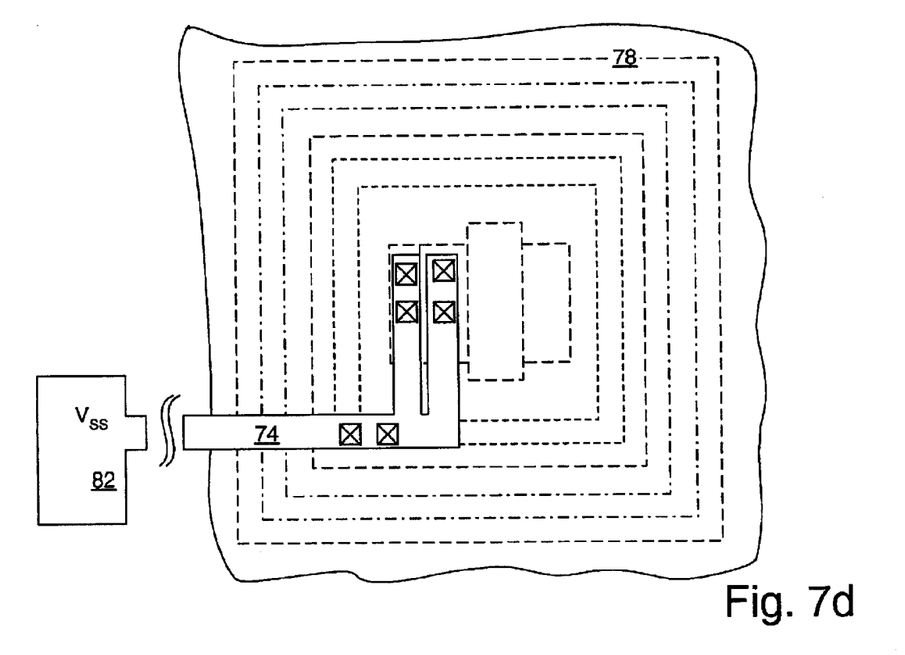

Connection of well 50 and guard ring 52 to opposite polarities of the power supply, as shown in FIG. 7a, may in some embodiments cause depletion regions within well 50 to merge below transistor 63. This may lead to turn-on of the parasitic bipolar npn transistor formed by regions 64, 50 and 65. It may be desirable, therefore, to have metallization adapted to not connect the well and guard ring to opposite supply polarities, i.e. to preclude such connection. In the embodiment of FIG. 7b, for example, interconnect 74 is still used to connect the source and well tap regions to $V_{SS}$ contact pad 82. Guard ring 52 is also connected to $V_{SS}$, however, using interconnect 84. In this embodiment, therefore, the well region and annular structure are connected to the same polarity of the power supply. In another embodiment interconnect 84 could be used to connect guard ring 52 to an on-chip filtered or "quiet" $V_{SS}$. The filtered $V_{SS}$ may be referred to as $V_{SSQ}$, and the external $V_{SS}$ as $V_{SSN}$. An example of this is illustrated in FIG. 7c, where guard ring 52 is connected to $V_{SSQ}$ contact pad 83, while the source and well tap are connected to $V_{SSN}$ contact pad 82. Such a connection may cause the $V_{SSQ}$ supply to be affected by noise associated with transistor 63, however. In another metallization embodiment shown in FIG. 7d, no interconnect is connected to annular structure 52, so that the annular structure and buried layer are left floating. By not providing an interconnect, the metallization in this embodiment precludes connection of the doped annular region to any supply voltage.

In the case of circuit portion 40 shown in FIG. 5, guard ring 52 is connected to buried layer 56, so that the two features are held at the same voltage (neglecting variation due to, for example, resistive losses). In another embodiment shown in FIG. 8, the buried layer is formed in two portions: a central portion 86 and a surrounding annular portion 88. Doped annular structure 52 is connected to outer buried layer portion 88. In this way, inner buried layer portion 86 remains floating no matter what voltage is applied to annular structure 52. The structure of FIG. 8, as well as the structure of FIG. 5 combined with the metallization embodiments of FIGS. 7a and 7b, may advantageously prevent merging of depletion regions in the well region under transistor 63.

Figure 8:
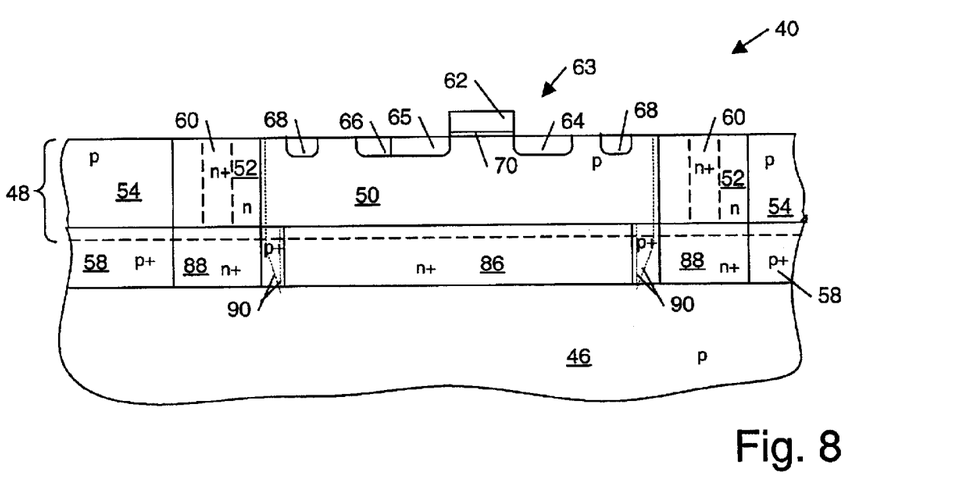
FIG. 8 is a partial cross-sectional view of the die portion with an alternative buried layer configuration.

The buried layer of FIG. 8 may be formed in a similar manner as described above for buried layer 56, but using a different patterned mask layer for the impurity introduction discussed with reference to FIG. 2. For example, rather than forming a single opening in a masking layer (e.g., a photoresist layer) as may be done to form n+ structure 42 of FIG. 2, two openings in a masking layer are formed to introduce impurities for buried layer portions 86 and 88. The spacing needed between two such openings in the masking layer depends on the final separation of the buried layer portions desired, allowing for diffusion during processing. The final desired separation in turn depends on details, such as doping levels, of the particular fabrication process used. In some embodiments, for example, a masking layer spacing of about 2.1 microns may result in a post-processing separation of about 1.2 microns between the buried layer portions. In an embodiment, the separation between the buried layer portions after processing is such that the oppositely-doped region between the portions is "pinched off" during operation by depletion regions at the lower end of the buried layer, while retaining some undepleted material at the upper end of the buried layer. Such an embodiment is illustrated using dashed-line depletion region boundaries 90 in FIG. 8. The buried layer separation may be designed so that the "pinch-off" occurs when outer buried layer portion 88 is connected to VCC (for an n+ buried layer). This "pinch-off" may substantially reduce the coupling of noise generated by n-channel transistor 63 to p-type substrate 46. It is noted that no new photolithography masks are required for implementation of the buried layer embodiments described herein (as compared to a conventional fabrication process using buried layers). The structures described herein may instead be implemented by modification of an existing buried layer mask.

It will be appreciated to those skilled in the art having the benefit of this disclosure that this invention is believed to provide an integrated circuit structure and method for providing buried layer substrate isolation. Further modifications and alternative embodiments of various aspects of the invention will be apparent to those skilled in the art in view of this description. For example, although described herein with reference to an MOS output transistor, the isolation structure and method may be applicable to other types of transistors, circuit elements, or circuit portions, such as non-output transistors, memory cells, or memory arrays. More than one transistor or other circuit element may be included within the isolation structure in some embodiments. It is intended that the following claims be interpreted to embrace all such modifications and changes and, accordingly, the specification and drawings are to be regarded in an illustrative rather than a restrictive sense.

What is claimed is:

1. An integrated circuit, comprising:
   a transistor formed in a well region of a semiconductor substrate, wherein the well region and the semiconductor substrate are of the same conductivity type; and
   a buried layer formed within the substrate below the well region, wherein the buried layer is of opposite conductivity type than the well region, and wherein the buried layer includes a first central portion underlying the transistor and a second annular portion spaced apart from and laterally surrounding the first portion.

2. The integrated circuit as recited in claim 1, further comprising a doped annular region of opposite conductivity type as the well region and extending past the well region to contact the second portion of the buried layer.

3. The integrated circuit as recited in claim 2, wherein the doped annular region laterally surrounds the transistor without surrounding other transistors of the integrated circuit.

4. The integrated circuit as recited in claim 1, wherein the first and second portions of the buried layer are separated by a distance of less than about 5 microns.

5. The integrated circuit as recited in claim 4, wherein the first and second portions of the buried layer are separated by a distance of approximately 1.2 microns.

6. The integrated circuit as recited in claim 2, further comprising one or more contact diffusions within the well region adapted for making contact to the well region.

7. The integrated circuit as recited in claim 6, wherein said one or more contact diffusions comprises a contact diffusion laterally adjacent to and in contact with the source region.

8. The integrated circuit as recited in claim 6, wherein said one or more contact diffusions comprises an annular contact diffusion arranged laterally within the doped annular region and laterally surrounding the transistor.

9. The integrated circuit as recited in claim 6, further comprising a contact to the doped annular region.

10. The integrated circuit as recited in claim 9, further comprising metallization adapted to connect the well region and the doped annular region to opposite polarities of a supply voltage.

11. The integrated circuit as recited in claim 2, further comprising an annular dielectric isolation region laterally surrounding the transistor.

12. The integrated circuit as recited in claim 1, wherein the transistor is an output transistor for the integrated circuit.

13. The integrated circuit as recited in claim 1, further comprising one or more analog circuit portions.

14. An integrated circuit, comprising:
   a transistor formed in a well region of a semiconductor substrate, wherein the well region is of the same conductivity type as the substrate;
   a buried layer formed within the substrate below the well region, wherein the buried layer is of opposite conductivity type than the well region, and wherein the buried layer includes a first central portion underlying the transistor and a second annular portion spaced apart from and laterally surrounding the first portion;

a doped annular region extending through the well region to contact the buried layer, wherein the doped annular region is of the same conductivity type as the buried layer; and metallization adapted to connect the well region to one polarity of a supply voltage for the integrated circuit, while precluding connection of the doped annular region to the other polarity of the supply voltage.

15. The integrated circuit as recited in claim 14, wherein the metallization is adapted to preclude connection of the doped annular region to any supply voltage of the integrated circuit.

16. The integrated circuit as recited in claim 14, wherein the metallization is adapted to connect the well region and doped annular region to the same polarity of the supply voltage.

17. The integrated circuit as recited in claim 14, wherein the transistor is an output transistor of the integrated circuit.

18. The integrated circuit as recited in claim 14, further comprising one or more analog circuit portions.

19. The integrated circuit as recited in claim 10, further comprising a depletion region bridging the separation between the first and second portions of the buried layer, during times in which the well region and the doped annular region are connected to said opposite polarities of the supply voltage.

20. The integrated circuit as recited in claim 19, wherein the depletion region bridges the separation at a lower end of the buried layer.

21. The integrated circuit as recited in claim 19, wherein the depletion region increases noise isolation between the well region and the substrate.

* * * * *